(12) United States Patent
Tan

(10) Patent No.: US 8,760,869 B2
(45) Date of Patent: Jun. 24, 2014

(54) ELECTRONIC DEVICE USING HEAT DISSIPATION ASSEMBLY

(75) Inventor: Zeu-Chia Tan, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 191 days.

(21) Appl. No.: 13/329,927

(22) Filed: Dec. 19, 2011

(65) Prior Publication Data

US 2013/0063886 A1 Mar. 14, 2013

(30) Foreign Application Priority Data

Sep. 9, 2011 (TW) .............................. 100132774 A

(51) Int. Cl.
*H05K 7/20* (2006.01)

(52) U.S. Cl.
USPC ........... 361/703; 361/689; 361/690; 361/702; 361/704; 361/709; 165/80.3

(58) Field of Classification Search
None
See application file for complete search history.

(56) References Cited

U.S. PATENT DOCUMENTS

| | | | | |
|---|---|---|---|---|
| 6,377,463 | B1* | 4/2002 | Shah | 361/720 |
| 7,111,667 | B2* | 9/2006 | Chang | 165/80.3 |
| 7,117,929 | B2* | 10/2006 | Curtis et al. | 165/80.3 |
| 7,623,346 | B2* | 11/2009 | Fujiya et al. | 361/694 |
| 7,667,970 | B2* | 2/2010 | Ma et al. | 361/704 |
| 7,733,649 | B2* | 6/2010 | Anderl et al. | 361/695 |
| 7,990,704 | B2* | 8/2011 | Cheng | 361/690 |
| 7,990,719 | B2* | 8/2011 | Chen et al. | 361/719 |
| 8,254,127 | B2* | 8/2012 | Chiu et al. | 361/710 |
| 8,385,066 | B2* | 2/2013 | Chang et al. | 361/697 |
| 8,459,343 | B2* | 6/2013 | Hung et al. | 165/185 |
| 2005/0128710 | A1* | 6/2005 | Beitelmal et al. | 361/709 |
| 2008/0041562 | A1* | 2/2008 | Bhatia | 165/80.3 |

* cited by examiner

*Primary Examiner* — Boris Chervinsky
(74) *Attorney, Agent, or Firm* — Novak Druce Connolly Bove + Quigg LLP

(57) ABSTRACT

An electronic device includes a central processing module having a base board, a central processing unit fixed to the base board, and a heat dissipation assembly secured to the base board. The heat dissipation assembly has a first heat sink, a second heat sink and an air deflector. The air deflector blocks an opening of the channel to deflect and guide airflow flow through the first heat sink and the second heat sink.

8 Claims, 3 Drawing Sheets

ELECTRONIC DEVICE USING HEAT DISSIPATION ASSEMBLY

BACKGROUND

1. Technical Field

The present disclosure relates to a heat dissipation assembly, a central processing module using the heat dissipation assembly, and an electronic device using the central processing module.

2. Description of the Related Art

Electronic devices such as laptops typically include a central processing unit or other electronic components that give off large amounts of heat. A heat dissipation unit may usually be attached on the central processing unit. Simplicity, low cost and good thermal dissipation performance are factors commonly considered when designing heat dissipation units for electronic components.

Therefore, there is room for improvement within the art.

BRIEF DESCRIPTION OF THE DRAWINGS

Many aspects of the present an electronic device can be better understood with reference to the following drawings. The components in the drawings are not necessarily drawn to scale, the emphasis instead being placed upon clearly illustrating the principles of the present an electronic device. Moreover, in the drawings, like reference numerals designate corresponding parts throughout the several views.

DETAILED DESCRIPTION

Figure 1:
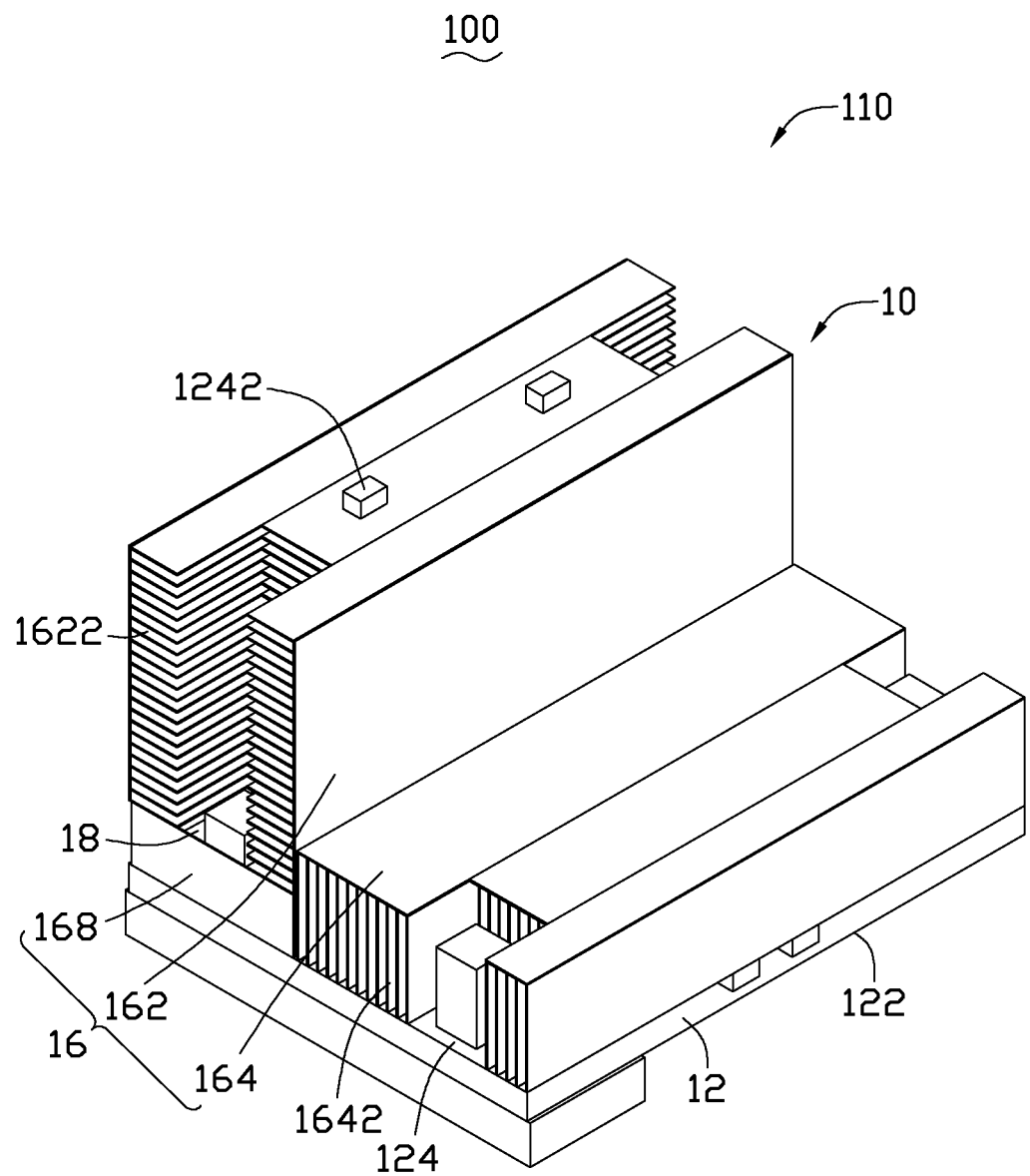
FIG. 1 is an isometric view of an electronic device including a heat dissipation assembly according to an exemplary embodiment.
Figure 2:
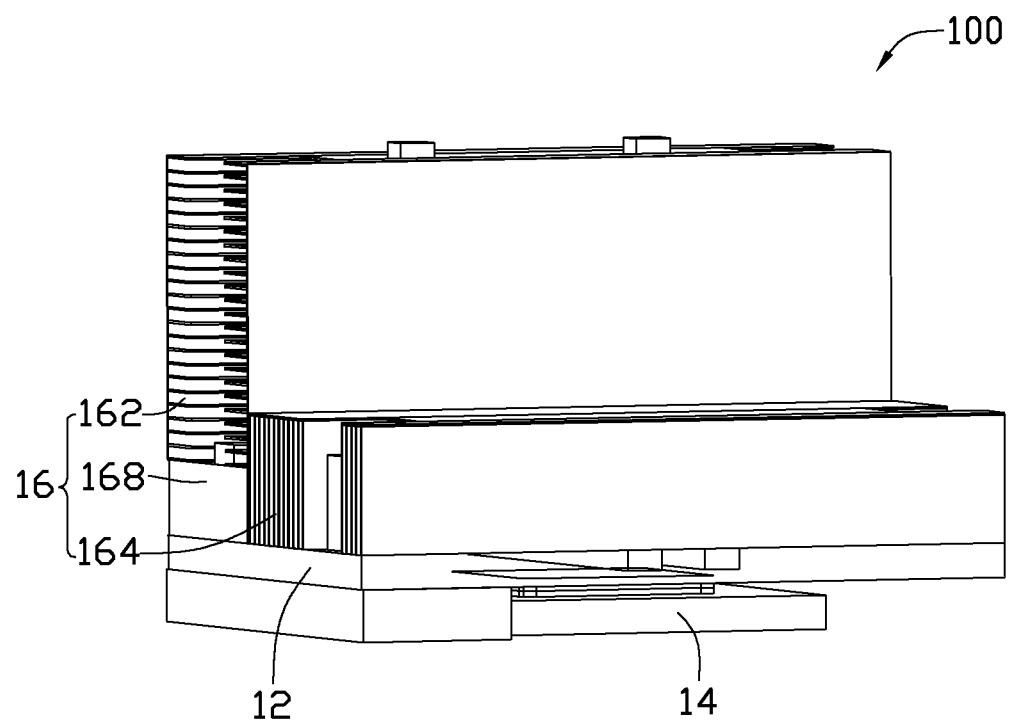
FIG. 2 is another isometric view of the electronic device, viewed from another angle.
Figure 3:
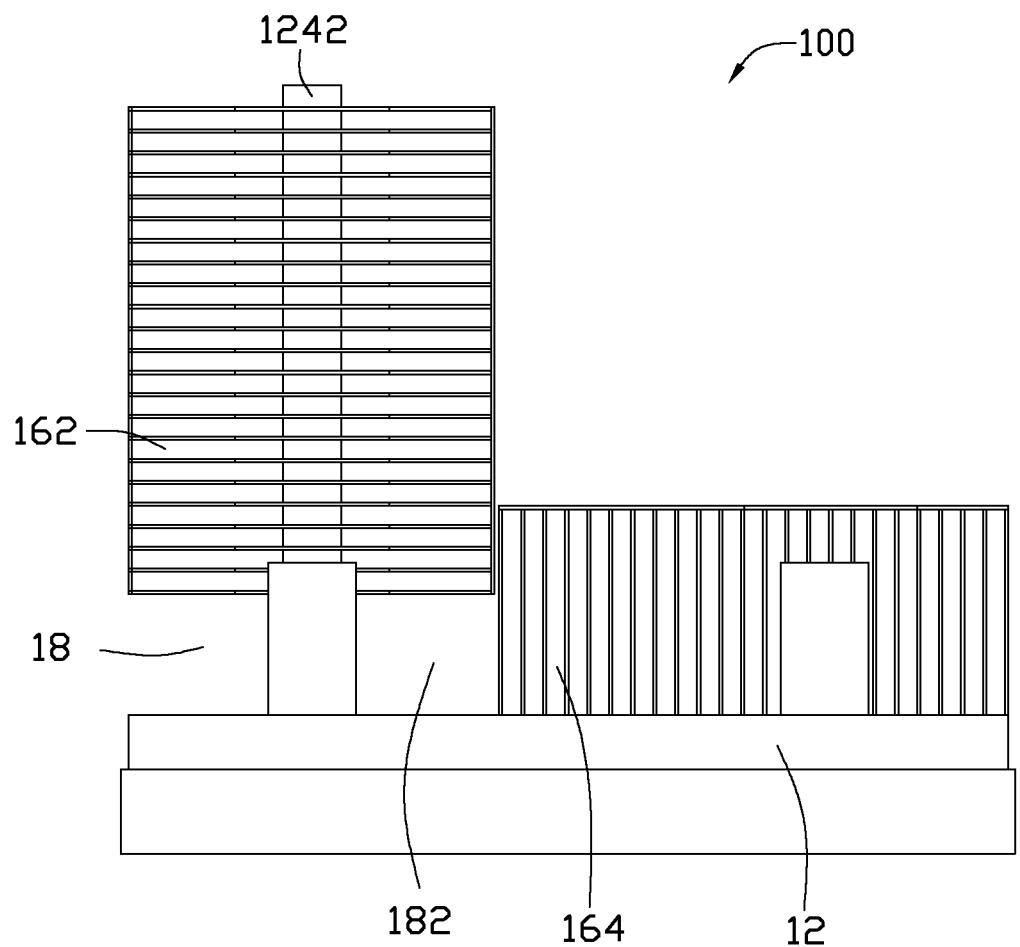
FIG. 3 is a side view of the electronic device with a removal of an air deflector.

FIG. 1 through FIG. 3 show an exemplary embodiment of an electronic device 100 such as a laptop and that includes a central processing module 110. The central processing module 110 includes a base board 12, a central processing unit 14, and a heat dissipation assembly 16. The central processing unit 14 is fixed to a bottom wall 122 of the base board 12 (best seen in FIG. 2). The heat dissipation assembly 16 is secured at an upper wall 124 of the base board 12 opposite to the central processing unit 14. The base board 12 can be made of thermal conductive materials such as aluminum and stainless steel.

The heat dissipation assembly 16 includes the base board 12, a first heat sink 162, a second heat sink 164 and an air deflector 168. The first heat sink 162, the second heat sink 164 and the air deflector 168 are secured at the same upper wall 124 of the base board 12. The second heat sink 164 abuts against the first heat sink 162. The first heat sink 162 includes a plurality of first fins 1622. The second heat sink 164 includes a plurality of second fins 1642. In this exemplary embodiment, the first fins 1622 are separately, horizontally and parallelly arranged with each other on the base board 12. The second fins 1642 are separately, vertically and parallelly arranged with each other on the base board 12. It is to be understood that the arrangement of fins 1622 and 1642 can be changed for achieving predetermined thermal conductivity of the heat sink or for any other purposes.

Two parallel securing poles 1242 for securing the first heat sink 162 vertically protrude from the upper wall 124 of the base board 12. The securing poles 1242 extend through and secure the first fins 1622. As best shown in FIG. 3, when the first heat sink 162 is secured with the securing poles 1242, the first heat sink 162 is positioned above the base board 12 with a space, cooperating with the base board 12, and the second heat sink 164 to enclose a channel 18. An end of the channel 18 defines an opening 182 blocked by the air deflector 168 secured between the upper wall 124 and the bottom-most of the first fins 1622. The air deflector 168 deflect the direction of cooling airflow directly towards the opening 182 and guide the cooling airflow towards and further through the first heat sink 162 and the second heat sink 164. Due to blocking of the air deflector 168, the channel 18 has no airflow from the opening 182. Large amount of the cooling airflow flow through the first heat sink 162 and the second heat sink 164, greatly enhancing the thermal conductivity of the heat dissipation assembly 16 and the whole thermal dissipation performance of the central processing module 110 and the electronic device 100.

It is to be understood that even though numerous characteristics and advantages of the present embodiments have been set forth in the foregoing description, together with details of assemblies and functions of various embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A heat dissipation assembly, comprising:
   a base board including two parallel securing poles vertically protruding therefrom;
   a first heat sink secured above the base board by the parallel securing poles;
   a second heat sink secured on the base board and abutting against the first heat sink;
   a channel defined between the first heat sink, the second heat sink and the base board, the channel defining an opening; and
   an air deflector blocking the opening to deflect and guide airflow flow through the first heat sink and the second heat sink.

2. The heat dissipation assembly as claimed in claim 1, wherein the first heat sink comprises a plurality of first fins, the air deflector is secured between the base board and the bottom-most of the first fins.

3. The heat dissipation assembly as claimed in claim 1, wherein the first heat sink comprises a plurality of first fins and the second heat sink comprises a plurality of second fins.

4. The heat dissipation assembly as claimed in claim 3, wherein the first fins are separately, horizontally and parallelly arranged with each other on the base board.

5. The heat dissipation assembly as claimed in claim 3, wherein the second fins are separately, vertically and parallelly arranged with each other on the base board.

6. A central processing module, comprising:
   a base board including two parallel securing poles vertically protruding therefrom;
   a central processing unit fixed to the base board;
   a heat dissipation assembly secured to the base board, comprising:
   a first heat sink secured above the base board by the parallel securing poles;
   a second heat sink secured on the base board and abutting against the first heat sink;
   a channel defined between the first heat sink, the second heat sink, and the base board, the channel defining an opening; and an air deflector blocking the opening to deflect and guide airflow flow through the first heat sink and the second heat sink.

7. The heat dissipation assembly as claimed in claim 6, wherein the base board is made of thermal conductive materials.

8. The heat dissipation assembly as claimed in claim 6, wherein the first heat sink comprises a plurality of first fins, the air deflector is secured between the base board and the bottom-most of the first fins.

* * * * *